(12) United States Patent
Norton et al.

(10) Patent No.: US 9,629,290 B2
(45) Date of Patent: Apr. 18, 2017

(54) ADHESIVELY BONDING JACKETS TO CENTRAL PROCESSING UNITS

(75) Inventors: John Norton, Houston, TX (US); Joseph Allen, Tomball, TX (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 1136 days.

(21) Appl. No.: 13/536,137

(22) Filed: Jun. 28, 2012

(65) Prior Publication Data
US 2014/0000811 A1   Jan. 2, 2014

(51) Int. Cl.
 *B32B 41/00* (2006.01)
 *H05K 13/02* (2006.01)
 *H05K 7/10* (2006.01)

(52) U.S. Cl.
 CPC ........... *H05K 13/02* (2013.01); *H05K 7/1061* (2013.01)

(58) Field of Classification Search
 CPC ...... H01L 2924/00; H01L 2224/48247; H05K 1/144; H05K 3/305; Y10T 29/49126
 USPC ...... 156/60, 64, 228, 244.27, 285, 295, 350, 156/358, 378, 379, 580; 29/830; 361/679.02
 See application file for complete search history.

(56) References Cited

U.S. PATENT DOCUMENTS

| | | | |
|---|---|---|---|
| 6,785,148 B1 | 8/2004 | Ishida et al. | |
| 7,086,144 B2 * | 8/2006 | Luo et al. | 29/741 |
| 7,121,865 B2 | 10/2006 | Bryant | |
| 2004/0212965 A1 | 10/2004 | Ishii et al. | |
| 2006/0034059 A1 * | 2/2006 | Luo | H05K 7/1053 361/704 |
| 2012/0106052 A1 | 5/2012 | Odineal et al. | |

OTHER PUBLICATIONS

Watercool e.K Installation Instructions Heatkiller CPU Rev 3.0. Germany.

* cited by examiner

*Primary Examiner* — Michael N Orlando
*Assistant Examiner* — Joshel Rivera
(74) *Attorney, Agent, or Firm* — Hewlett Packard Enterprise Patent Department

(57) ABSTRACT

A base includes apertures and surface features for precisely aligning central processing units (CPUs) and jackets with each other. Applicator heads are used to exert contact force against respective jackets during adhesive bonding to the CPUs. Each jacket functions as a gripping or handling feature during subsequent positioning or transport of the corresponding CPU. Such CPUs can be inserted into servers or other entities by way of automated mechanisms or manual operations with reduced risk of damage, misalignment or other problems.

20 Claims, 6 Drawing Sheets

ADHESIVELY BONDING JACKETS TO CENTRAL PROCESSING UNITS

BACKGROUND

Central processing units (CPUs) are used in a broad range of computers, instruments and automated systems. Servers are one of numerous such examples that operate by way of one or more CPUs acting in accordance with a program code. Such servers generally perform file transfers, information storage and retrieval, and other data handling or calculation tasks.

Insertion or removal of a CPU within a server is now commonly performed by manual processes. Due to this manual installation process, misalignment with a receiving socket, incomplete insertion, damaged socket walls, bent socket pins or CPU warping issues often occur. The present teachings address the foregoing and related concerns.

BRIEF DESCRIPTION OF THE DRAWINGS

The present embodiments will now be described, by way of example, with reference to the accompanying drawings, in which.

DETAILED DESCRIPTION

Introduction

A base includes apertures and surface features for precisely aligning central processing units (CPUs) and jackets with each other. Applicator heads are used to exert contact force against the respective jackets during adhesive bonding to the CPUs. Each jacket functions as a gripping or handling feature during subsequent positioning or transport of the corresponding CPU. Such CPUs can be inserted into servers or other entities by way of automated mechanisms or manual processes with reduced risk of damage, misalignment or other problems.

In one example, an apparatus includes a base defining an aperture and alignment features about the aperture. The alignment features are configured to align an electronic entity and a jacket with each other and with the aperture. The apparatus also includes an applicator head configured to be aligned with the aperture by way of at least some of the alignment features. The apparatus further includes a force applicator configured to controllably move the applicator head into and out of force contact with the jacket supported by the base.

In another example, an apparatus for adhesively bonding jackets central processing units includes a base defining a plurality of through apertures. Each through aperture is configured to receive at least a portion of a central processing unit (CPU), and the base defines alignment features about each of the through apertures. The apparatus also includes a plurality of applicator heads each configured to apply a contact force to a jacket. Each applicator head is configured to be aligned with one of the through apertures by way of one or more of the alignment features. The apparatus further includes a force applicator configured to controllably move the applicator heads towards and away from the base.

Illustrative Assembly

Figure 1:
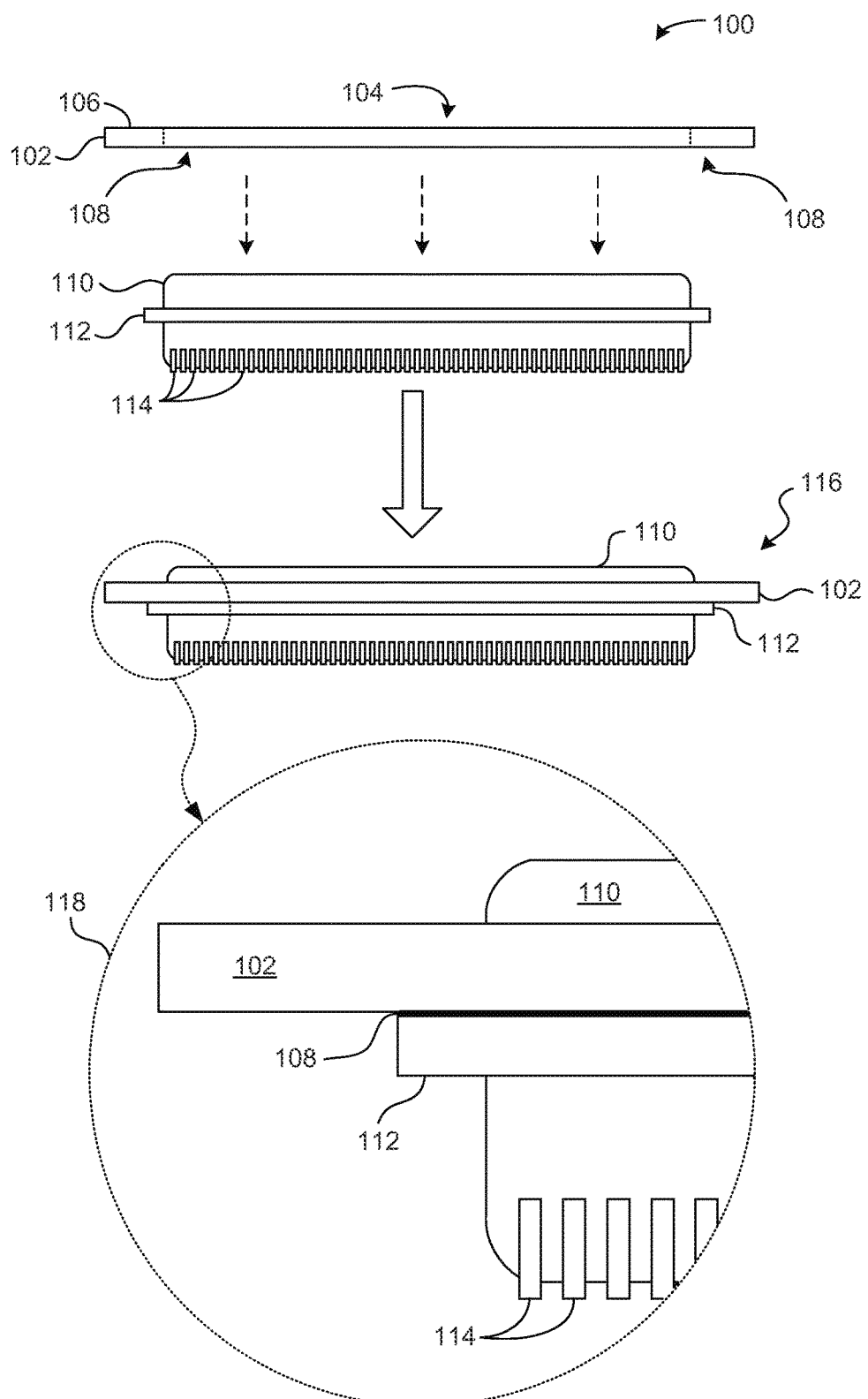
FIG. 1 depicts an assembly including a central processing unit and a jacket according to one example of the present teachings.

Attention is now turned to FIG. 1, which depicts an assembly 100 according to the present teachings. The assembly 100 is illustrative and non-limiting with respect to the present teachings. Other systems, devices, assemblies and arrangements can also be defined and used.

The assembly 100 includes a jacket 102. The jacket 102 is also referred to as a carrier 102 for purposes herein. The jacket 102 can be formed from any suitable material such as plastic, nylon, and so on. The jacket 102 defines a central void 104 and an outer edge or periphery 106. The jacket 102 is configured to be adhesively bonded to a CPU (described below). The jacket 102 bears an adhesive material or layer 108 on at least a portion of a bottom surface of the periphery 106.

The assembly 100 also includes a central processing unit (CPU) or processor 110. The CPU 110 includes a shoulder portion or flange 112 defining an outward-extending periphery. The CPU 110 also includes a plurality of distinct electrically conductive leads (i.e., contacts or nodes) 114 disposed along (or about) a bottom edge. The CPU 110 is illustrative and non-limiting with respect to the present teachings and other processors, electronic entities or components having respectively varying form factors or other characteristics can also be used.

An assembled entity 116 includes the jacket 102 adhesively bonded to the CPU 110 by way of the shoulder portion 112. The jacket 102 and the CPU 110 now define a combined or integrated device. A detail view 118 of a portion of the assembled entity 116 depicts the bonding of the jacket 102 to the CPU 110 by way of the adhesive material 108.

The assembled entity 116 can now be transported, positioned or installed using automated mechanisms or manual processes by way of grasping the jacket 102. The jacket 102 can further include particular apertures and surface features used in alignment with the CPU 110 during bonding, and to ensure full insertion of the CPU 110 into a receiving socket within a server, desktop computer, laptop computer or other apparatus.

Illustrative Jacket

Figure 2:
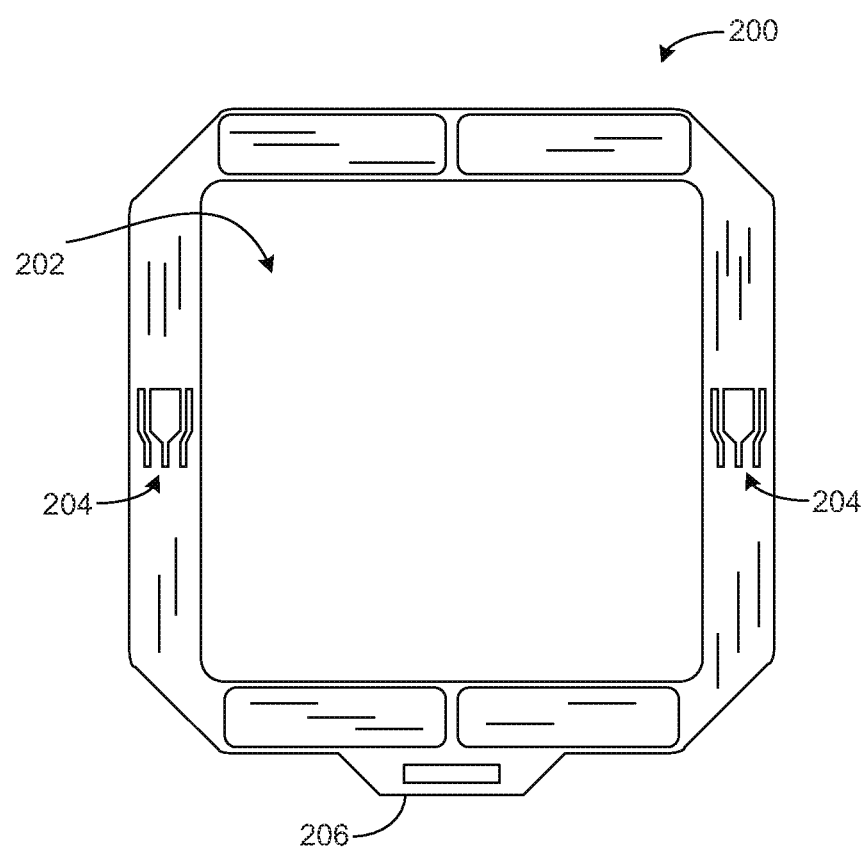
FIG. 2 depicts a plan view of a jacket according to another example.

Reference is now made to FIG. 2, which depicts a plan view of a jacket 200 in accordance with the present teachings. The jacket 200 is illustrative and non-limiting in nature, and other jackets (i.e., carriers) having respectively varying characteristics or features can also be used.

The jacket 200 is formed from plastic, nylon or another suitable, electrically non-conductive material. In one example, the jacket 200 is defined by a nominal thickness of about 1.6 millimeters, being perpendicular to the plane of the depicted view. Other suitable thicknesses can also be used. The jacket 200 defines a central void or through aperture 202 of appropriate size and form-factor to receive a portion of a corresponding CPU (e.g., 110) and to make contact with the shoulder portion (e.g., 112) thereof. Thus, the jacket 202 is configured to define an extended periphery about the CPU to which it is bonded.

The jacket 200 also defines respective keying (or alignment) features 204. Each keying feature 204 includes a through aperture configured to receive a guide pin or post used during alignment with a CPU and as described hereinafter. The jacket 200 further includes an extension or tab-like feature 206 that can be used in identifying orientation once the jacket 200 is bonded to a CPU. Text, serial numbers or other indicia can be included (printed or formed upon) the jacket 200, as well.

Illustrative Jacket Assembly Fixture

Figure 3:
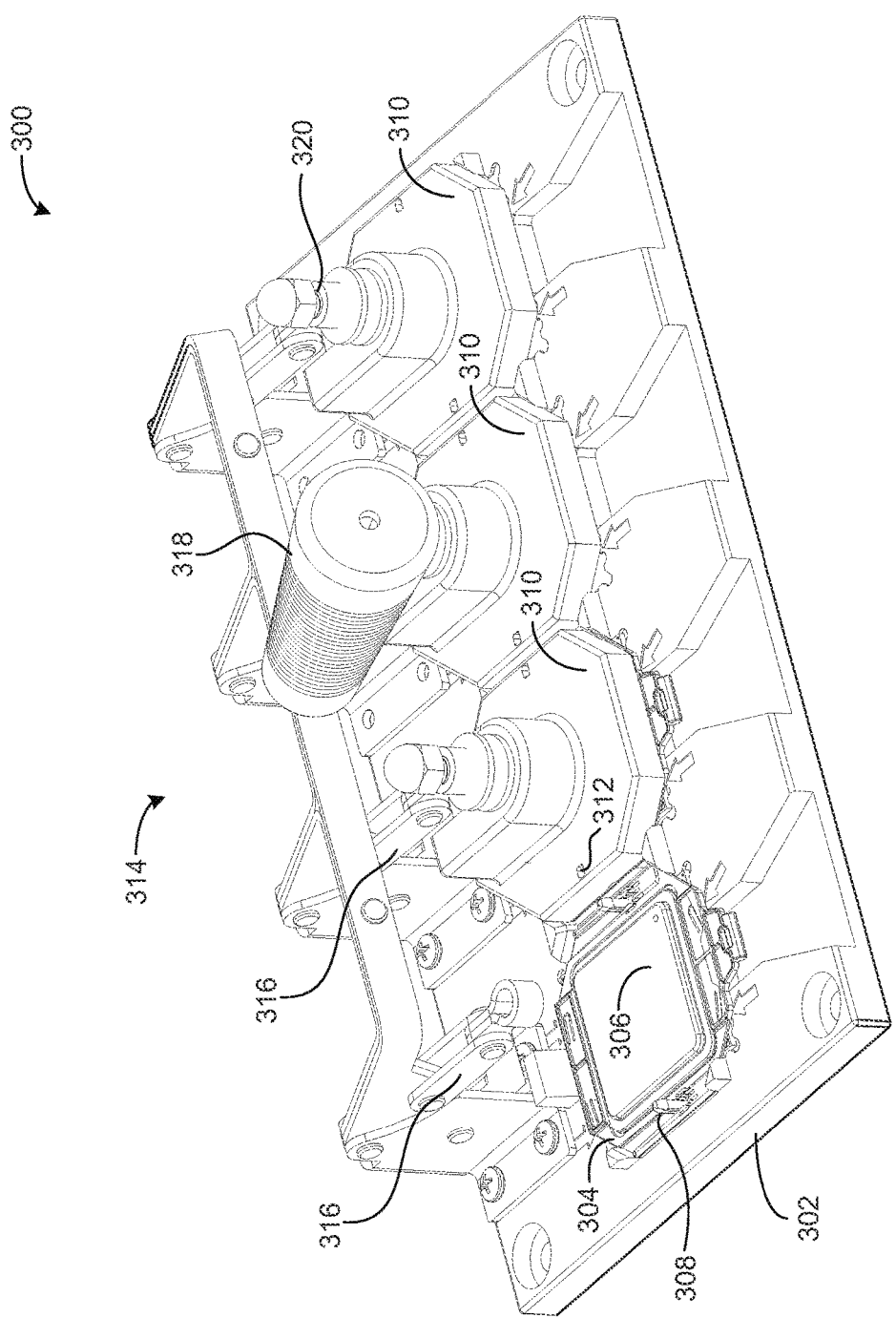
FIG. 3 depicts a jacket assembly fixture according to yet another example.

Attention is turned now to FIG. 3, which depicts a jacket assembly fixture (fixture) 300 in accordance with the present teachings. The fixture 300 is illustrative and non-limiting in nature, and other fixtures having respectively varying characteristics and elements are also contemplated.

The fixture 300 includes a base 302. The base 302 is configured to support a plurality of jackets 304 in precise alignment with respective CPUs 306 to which they will be adhesively bonded (or fixed). The base 302 includes respective posts (or extensions) 308 configured to function in the alignment process. Other "keying features" described hereinafter are also included.

The fixture 300 further includes a plurality of applicator heads (heads) 310. Each head 310 is configured to align with and receive at least an upper portion of a CPU 306 and to apply pressure force to portions of a jacket 304 during the adhesive bonding process. Each head 310 defines through apertures 312 configured to receive a corresponding post 308 in the interest of accurate alignment with the CPU 306 and the jacket 304 being bonded thereto. Each head 310 can include other keying or alignment features as described hereinafter. The fixture 300 is configured to include a total of four heads 310, however one such head 310 is omitted from FIG. 3 in the interest of clarity. Other configurations having other respective head 310 counts can also be used.

The fixture 300 further includes a force application mechanism (mechanism) 314. The mechanism 314 is configured to be fixedly secured to the base 302 and to support the plurality of heads 310 by way of respective articulating linkages 316. The mechanism 314 also includes a handle 318 mechanically coupled to the respective linkages 316 such that the heads 310 can be displaced toward and away from the base 302 by way of user manual force input. The mechanism also features respective springs 320 each configured to provide a loading force mechanically coupled to a respective head 310. The mechanism 314 is configured such that a specific and effective level of contact force can be applied to each jacket 304 so as to bond it to the corresponding CPU 306.

Typical normal use of the fixture 300 is as follows: the handle 318 is manipulated by a user so as to raise all of the heads 310 away from the base 302. CPUs 306 are placed into and supported by respective receiving areas defined in the base 302. Thus, each CPU 306 is disposed so as to be acted upon by a respective one of the heads 310.

A respective jacket 304 is then placed in overlapping alignment with each of the CPUs 306 supported by the base 302. Alignment of each jacket 304 is performed by way of the posts 308 and corresponding apertures or keying features (e.g., 204). The adhesive material (e.g., 108) borne by each jacket 304 is in contact with a shoulder portion (e.g., 112) of the particular CPU 306 to which it is to be bonded.

The user then manipulates the handle 318 such that the heads 310 come into aligned contact with the respective jackets 304, applying a downward compressive force on each and causing complete adhesive bonding to the corresponding CPUs 306. Thus, the base 302 exerts a "normal" force counter to that of the head 310 such that the jacket, CPU and adhesive are clamped there between. The user then raises the heads 310 away from the base 302 after a brief dwell time by way of the handle 308. The individual assembled entities (e.g., 116), each including a CPU 306 and a jacket 304, can be removed from the base 302 for use, installation, storage and so on.

Illustrative Base

Figure 4:
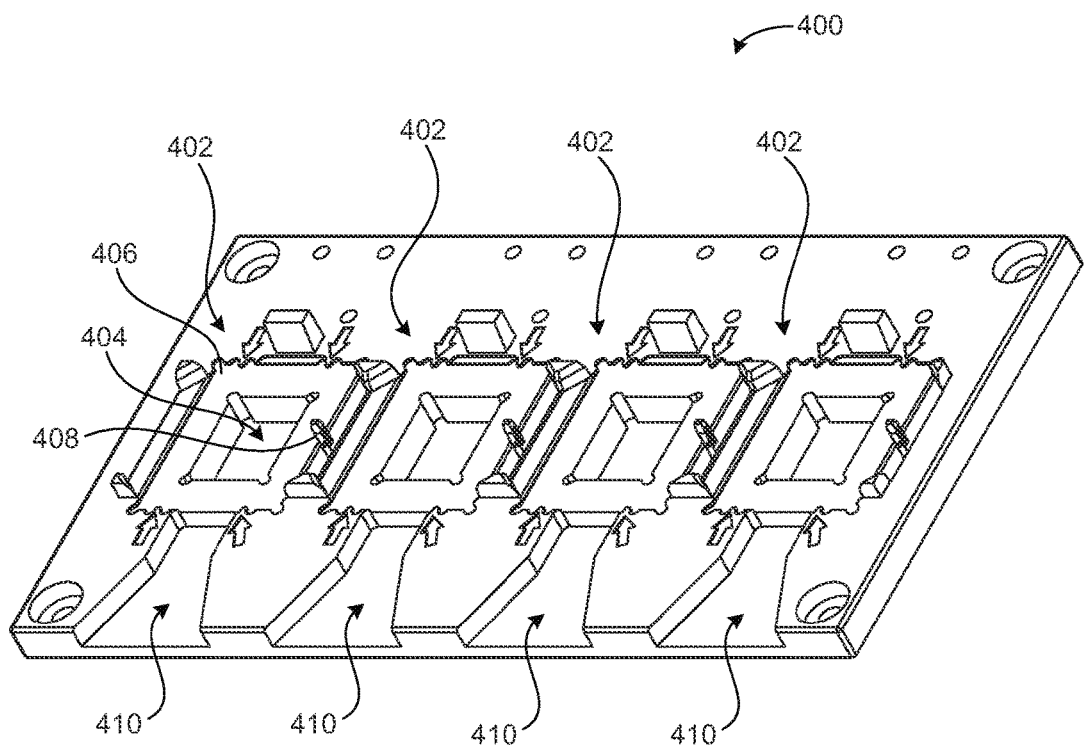
FIG. 4 depicts a base in accordance with another example.

Reference is now made to FIG. 4, which depicts a base 400. The base 400 is illustrative and non-limiting in nature, and other bases, devices and apparatus having other respectively varying configurations and features can also be used. In one example, the base 400 is equivalent to the base 302 described above.

The base 400 is formed from any suitable rigid material such as anti-electrostatic plastic, and so on. The base 400 includes four placement areas 402 configured to align a CPU with a jacket to be bonded thereto. Each placement area 402 is also referred to as a "nest" for purposes herein. Each placement area 402 is defined by a central void or aperture 404 configured to receive a CPU (e.g., 306) and to support it there in precise alignment with other surrounding features. Each placement area 402 is further defined by a recessed portion 406 about the aperture 404, configured to align a jacket (e.g., 304) with the respective CPU.

The base 400 also includes a plurality of posts (extensions) 408 each associated with a respective one of the placement areas 402. Each post 408 is configured to be received within a keying feature (e.g., 204) of a jacket. Also, each post 408 is configured to guide an applicator head (e.g., 310) into precise alignment with a respective placement area 402 and—more specifically—a jacket to be bonded to a CPU. The base further includes a plurality of chutes or channels 410, each associated with and extending outward from a respective placement area 402. Each channel 410 is configured to accommodate manual or machine access (placement or removal) of a CPU or jacket within the corresponding placement area 402.

The base 400 includes other features such as user guides or placement arrows, raised retaining features, and the like, in the interest of ensuring precise alignment of CPUs and jackets to be bonded there. These features and those described above are particular to one of many possible embodiments and can be respectively varied as contemplated by the present teachings.

Illustrative Applicator Head

Figure 5:
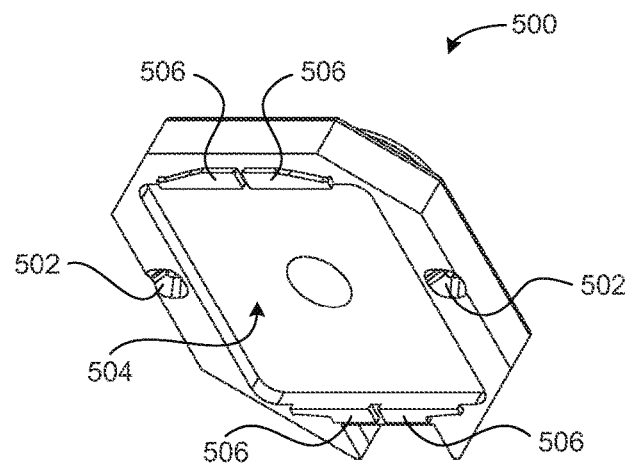
FIG. 5 depicts an applicator head in accordance with another example.

Reference is made now to FIG. 5, which depicts an applicator head (head) 500. The head 500 is illustrative and non-limiting in nature, and other heads, devices and apparatus having other respectively varying configurations and features can also be used. In one example, the head 500 is equivalent to one of the applicator heads 310 described above.

The head 500 is formed from any suitable rigid material. The head 500 defines a pair of respective apertures 502 configured to receive a post (e.g., 308) or similar keying feature in the interest of precise alignment with a jacket and CPU supported on a base (e.g., 302). The head 500 also includes or defines a recessed area (void, or cavity) 504 configured to receive and align with a portion of a CPU (e.g., 306) during bonding of a jacket (e.g., 304) thereto. The head 500 also includes or defines a plurality of raised areas 506 configured to make contact with a jacket during bonding to a CPU.

The head 500 is configured to be mechanically coupled to and supported by a force application mechanism (e.g., 314). The head 500 can be manually, electrically, pneumatically, hydraulically or otherwise suitably positioned in order to make force contact with a jacket while adhesively bonding it to a corresponding CPU. The form and surface features of the head 500 are configured to ensure thorough adhesion (i.e., complete "wetting") of the adhesive material (e.g., 108) during the bonding procedure.

Illustrative Base Tray

Figure 6A:
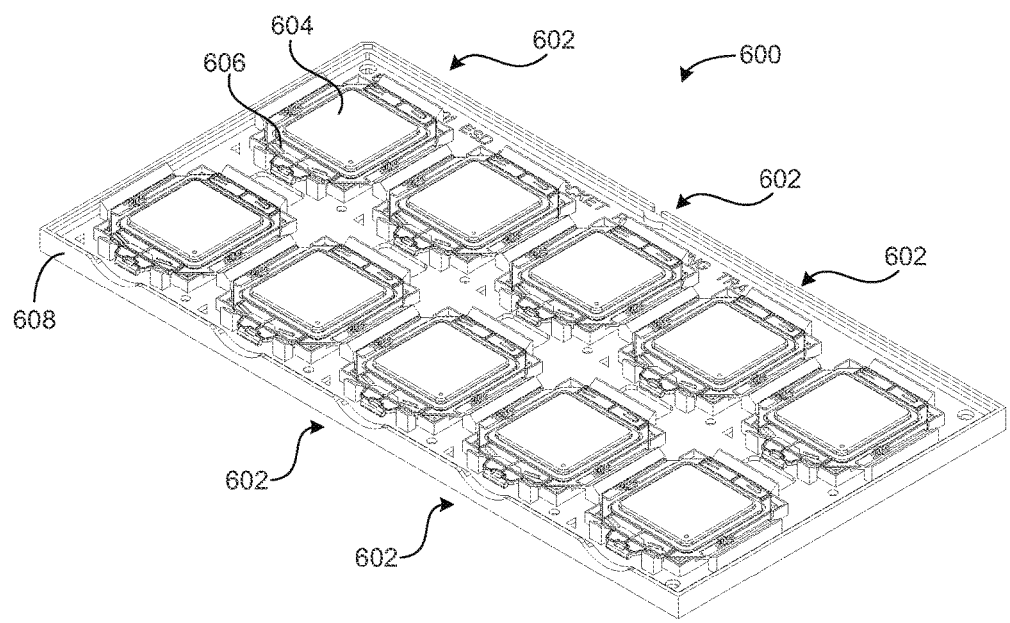
FIG. 6A depicts a base tray in accordance with another example of the present teachings.
Figure 6B:
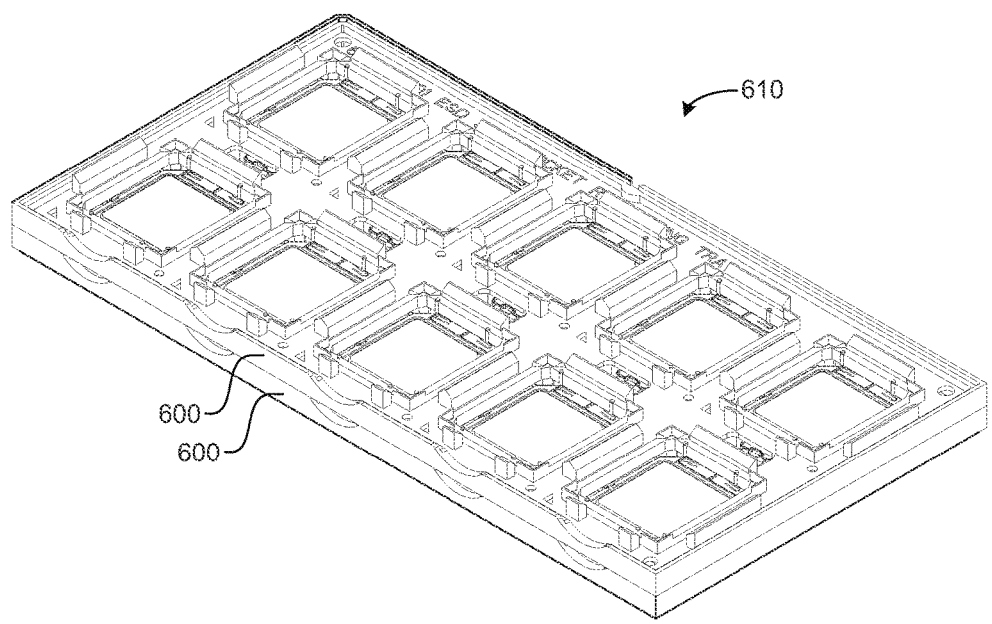
FIG. 6B depicts a stacked arrangement of the base trays of FIG. 6A.

Attention is turned now to FIGS. 6A and 6B, which depict respective base trays 600. Each base tray 600 is illustrative and non-limiting in nature, and other tray-like bases, devices and apparatus having other respectively varying configurations and features can also be used. Each base tray 600 can be formed from any suitable rigid material such as anti-electrostatic plastic and the like.

The base tray 600 includes or defines ten placement areas 602. Each placement area 602 is configured to support a CPU 604 and a jacket 606 in aligned, bondable relationship with each other. The base tray 600 includes keying features (i.e., posts, recessed areas, and so on) analogous to those described above. Additionally, the base tray 600 includes a sidewall 608 defined about the periphery. The sidewall 608 defines a support surface such that two or more like base trays 600 can be stacked on top of each other for storage, transport, and so on. Reference is made to the stacked arrangement 610 as depicted by FIG. 6B.

The base tray(s) 600 are illustrative of yet another of numerous configurations contemplated by the present teachings. Each base tray 600 is usable in association with a corresponding number of applicator heads (e.g., 310, 500) displaceable by a force application mechanism (e.g., 314).

Illustrative Bonding System Arrangement

Figure 7:
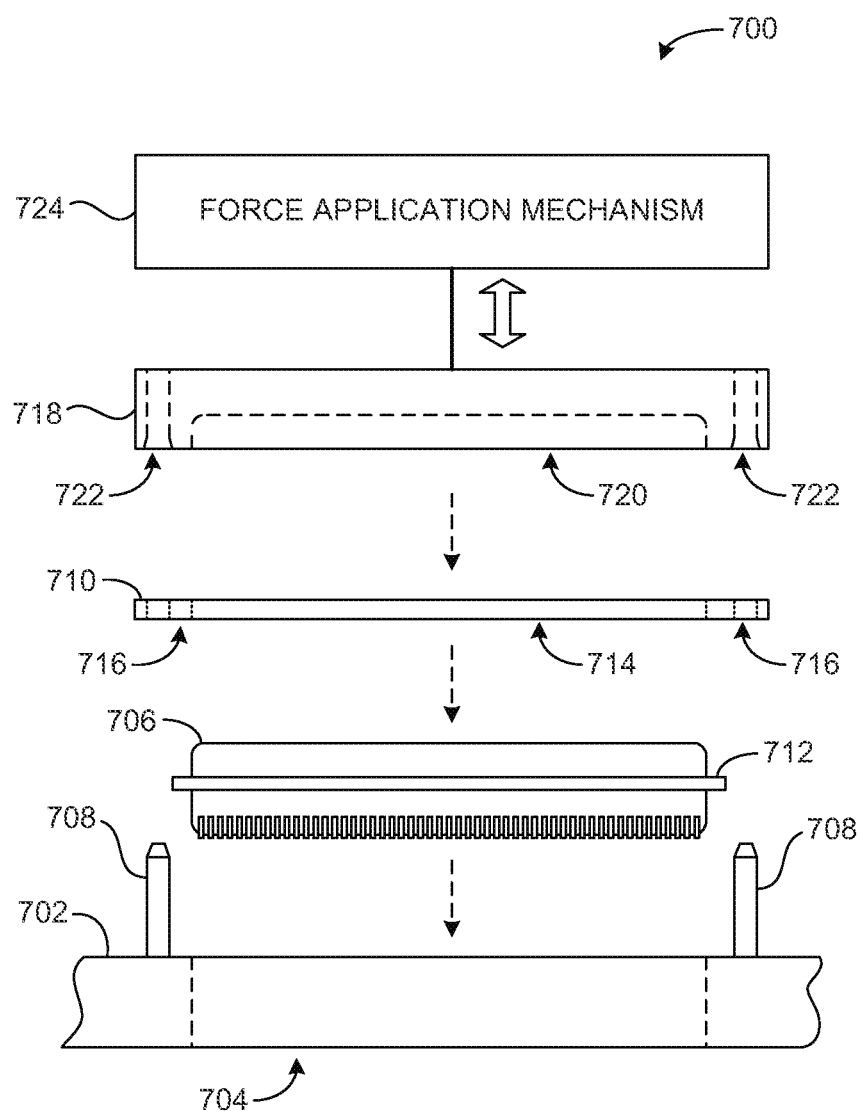
FIG. 7 depicts schematic diagram of a bonding system arrangement in accordance with the present teachings.

Reference is made now to FIG. 7, which depicts a schematic diagram of a system 700. The system 700 is illustrative and non-limiting in nature, and other arrangements and configurations can also be used. Thus, the system 700 depicts general concepts and cooperative elements that can be respectively varied.

The system 700 includes a base 702 defined by (or defining) a void or aperture 704 configured to receive a portion of a CPU 706. The base 702 also includes a pair of posts 708 that function as keying features to aid in the precision alignment of elements during a bonding process. The system 700 also includes a jacket 710 configured to be adhesively bonded to a shoulder (or flange) portion 712 of the CPU 706. The jacket 710 includes a central aperture 714 to receive a portion of the CPU 706, and respective apertures (or keying features) 716 to receive corresponding ones of the posts 708.

The system 700 also includes an applicator head (head) 718. The head 718 includes or defines a cavity 720 configured to receive and align with a portion of the CPU 706 during bonding operations. The head 718 also includes or defines respective apertures 722 configured to receive the corresponding posts 708 so as to precisely align with the base 702, and thus the jacket 710 and the CPU 706, as well.

The system 700 further includes a force application mechanism (mechanism) 724. The mechanism 724 can include or be defined by any suitable manual, electrical, pneumatic, hydraulic or other arrangement configured to displace the head 718 toward and away from the base 702. The mechanism 724 is therefore configured to apply a compressive (or clamping) contact force so to ensure thorough adhesive bonding of the jacket 710 to the CPU 706.

The base 702, head 718 and jacket 710 therefore include or are configured to define respective alignment or keying features that cooperate in the precisely aligned bonding of the jacket 710 to the CPU 706. These respective features can include, but are not limited to, posts, cavities, apertures, and so on. Other suitable features can also be used in the precise alignment of jackets with respective CPUs during repetitive bonding operations. In this way, assembled entities (e.g., 116) can be fabricated in significant quantities and handled, positioned, transported, inserted within or removed from electronic circuit boards by way of automated machinery with increased certainty and at reduced cost.

In general, the foregoing description is intended to be illustrative and not restrictive. Many embodiments and applications other than the examples provided would be apparent to those of skill in the art upon reading the above description. The scope of the invention should be determined, not with reference to the above description, but should instead be determined with reference to the appended claims, along with the full scope of equivalents to which such claims are entitled. It is anticipated and intended that future developments will occur in the arts discussed herein, and that the disclosed systems and methods will be incorporated into such future embodiments. In sum, it should be understood that the invention is capable of modification and variation and is limited only by the following claims.

What is claimed is:

1. An apparatus, comprising:
    a base defining a plurality of apertures and comprising alignment features about each of the apertures, the alignment features configured to align an electronic entity and a jacket with each other and the aperture;
    a plurality of pivotably supported applicator heads joined to one another to pivot in unison, each applicator head to be aligned with the aperture by way of at least some of the alignment features; and
    a force applicator to controllably pivot the plurality of applicator heads into and out of force contact with the jacket supported by the base.

2. The apparatus according to claim 1, at least some of the alignment features defined by respective protrusions extending away from base.

3. The apparatus according to claim 1, the applicator head defining one or more contact pad areas configured to contact the jacket.

4. The apparatus according to claim 1, the force applicator including at least one of a user-input force mechanism, an electrically motorized force mechanism, or a pneumatic force mechanism.

5. The apparatus according to claim 1, the force applicator including a spring configured to provide a loading force mechanically coupled to the applicator head.

6. The apparatus according to claim 1, the base formed from an anti-electrostatic plastic material.

7. The apparatus according to claim 1, the base comprises a stackable tray.

8. The apparatus according to claim 1, wherein the aperture of the base is shaped to receive a central processing unit (CPU) and wherein the base comprises a rim about the aperture to underlie the jacket which is to be adhesively bonded to the CPU by way of the apparatus.

9. An apparatus for adhesively bonding jackets to central processing units, comprising:
    a base defining a plurality of through apertures, each through aperture configured to receive at least a portion of a central processing unit (CPU), the base defining alignment features about each of the through apertures;
    a plurality of applicator heads joined to one another to pivot in unison, each of the plurality of applicator heads configured to apply a contact force to a jacket, each applicator head configured to be aligned with one of the through apertures by way of one or more of the alignment features; and a force applicator configured to controllably move the applicator heads toward and away the base.

10. The apparatus according to claim 9, wherein each through aperture is shaped to receive a central processing unit and wherein the base comprises a rim about the aperture to underlie a jacket.

11. The apparatus according to claim 9, the base configured to be stackable with respect to other like bases.

12. The apparatus according to claim 9, the force applicator defined by a manual input device, an electrically actuated device, or a pneumatically actuated device.

13. The apparatus according to claim 9, the base formed from an anti-electrostatic material.

14. The apparatus according to claim 9, the applicator heads and the force applicator defining an application entity, the base being moveable into and out of cooperative orientation with the application entity.

15. The apparatus of claim 1, wherein the plurality of applicator heads are pivotably coupled to the base.

16. The apparatus of claim 1, wherein each of the plurality of heads comprises openings and wherein the alignment features of the base comprise posts located to project outside of the electronic entity received within the respective aperture while extending through the associated jacket and into the openings of the associated head.

17. The apparatus of claim 9, wherein the plurality of applicator heads are pivotably coupled to the base.

18. The apparatus of claim 9, wherein each of the plurality of heads comprises openings and wherein the alignment features of the base comprise posts located to project outside of the electronic entity received within the respective aperture while extending through the associated jacket and into the openings of the associated head.

19. A method comprising:
positioning a central processing unit within each of a plurality of apertures in a base to position the central processing unit at a predefined location;
positioning a jacket over each of the central processing units within the plurality of apertures such that posts projecting from the base about each of the apertures project through corresponding apertures in the jacket to align the jacket with the predefined location of the central processing unit in the base;
pivoting, in unison, a plurality of applicator heads into contact with the jackets and the central processing units and such that the posts project into corresponding apertures in corresponding applicator heads to align the applicator heads with respect to the jackets, with respect to the central processing units and with respect to the base.

20. The method of claim 19 further comprising adhesively bonding each jacket to its associated central processing unit while the central processing unit is received within the aperture of the base and while each jacket is contacted by the applicator head.

* * * * *